(12) United States Patent
Clevenger et al.

(10) Patent No.: US 8,304,912 B2
(45) Date of Patent: Nov. 6, 2012

(54) STRUCTURE AND METHOD FOR MOSFET GATE ELECTRODE LANDING PAD

(75) Inventors: Lawrence A. Clevenger, LaGrangeville, NY (US); Timothy J. Dalton, Ridgefield, CT (US); Louis C. Hsu, Fishkill, NY (US); Carl Radens, LaGrangeville, NY (US); Kwong Hon Wong, Wappingers Falls, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 12/054,644

(22) Filed: Mar. 25, 2008

(65) Prior Publication Data

US 2008/0164525 A1    Jul. 10, 2008

Related U.S. Application Data

(63) Continuation of application No. 11/333,068, filed on Jan. 17, 2006, now Pat. No. 7,528,065.

(51) Int. Cl.
*H01L 23/48* (2006.01)
(52) U.S. Cl. ................... 257/774; 257/E21.59
(58) Field of Classification Search .................. 257/774, 257/E21.59
See application file for complete search history.

(56) References Cited

U.S. PATENT DOCUMENTS

| | | | |
|---|---|---|---|
| 4,378,629 A | 4/1983 | Bozler et al. | |
| 4,675,711 A | 6/1987 | Harder et al. | |
| 4,687,537 A * | 8/1987 | Hoffman et al. | 117/106 |
| 4,727,047 A | 2/1988 | Bozler et al. | |
| 4,816,420 A | 3/1989 | Bozler et al. | |
| 4,837,182 A | 6/1989 | Bozler et al. | |
| 4,933,297 A * | 6/1990 | Lu | 438/620 |
| 5,006,912 A | 4/1991 | Smith et al. | |
| 5,032,538 A | 7/1991 | Bozler et al. | |
| 5,090,254 A | 2/1992 | Guckel et al. | |
| 5,188,983 A | 2/1993 | Guckel et al. | |
| 5,213,990 A | 5/1993 | Rodder | |
| 5,217,564 A | 6/1993 | Bozler et al. | |
| 5,273,616 A | 12/1993 | Bozler et al. | |
| 5,298,787 A | 3/1994 | Bozler et al. | |
| 5,328,549 A | 7/1994 | Bozler et al. | |
| 5,362,682 A | 11/1994 | Bozler et al. | |
| 5,428,259 A | 6/1995 | Suzuki | |
| 5,516,710 A | 5/1996 | Boyd et al. | |
| 5,549,747 A | 8/1996 | Bozler et al. | |
| 5,554,304 A | 9/1996 | Suzuki | |
| 5,588,994 A | 12/1996 | Bozler et al. | |
| 5,614,425 A | 3/1997 | Kimura et al. | |

(Continued)

OTHER PUBLICATIONS

Chinese Office Action 2011061000606510, Jun. 15, 2011, 7 pages.

*Primary Examiner* — Bradley K Smith
*Assistant Examiner* — Amar Movva
(74) *Attorney, Agent, or Firm* — Gibb & Riley, LLC; Louis J. Percello, Esq.

(57) ABSTRACT

A transistor device and method of forming the same comprises a substrate; a first gate electrode over the substrate; a second gate electrode over the substrate; and a landing pad comprising a pair of flanged ends overlapping the second gate electrode, wherein the structure of the second gate electrode is discontinuous with the structure of the landing pad.

16 Claims, 7 Drawing Sheets

U.S. PATENT DOCUMENTS

| | | | |
|---|---|---|---|
| 5,676,752 A | 10/1997 | Bozler et al. | |
| 5,710,078 A * | 1/1998 | Tseng | 438/620 |
| 5,843,820 A | 12/1998 | Lu | |
| 5,907,779 A | 5/1999 | Choi | |
| 5,923,971 A | 7/1999 | Ho et al. | |
| 6,063,677 A | 5/2000 | Rodder et al. | |
| 6,137,149 A * | 10/2000 | Kodama | 257/408 |
| 6,218,693 B1 | 4/2001 | Lu | |
| 6,236,090 B1 | 5/2001 | Fujisawa | |
| 6,319,786 B1 | 11/2001 | Gris | |
| 6,340,829 B1 * | 1/2002 | Hirano et al. | 257/347 |
| 6,465,312 B1 | 10/2002 | Yu | |
| 6,555,880 B2 | 4/2003 | Cabral, Jr. et al. | |
| 6,597,045 B2 | 7/2003 | Gonzalez et al. | |
| 6,602,767 B2 | 8/2003 | Nishida et al. | |
| 6,614,069 B2 | 9/2003 | Rosner et al. | |
| 6,645,861 B2 | 11/2003 | Cabral, Jr. et al. | |
| 6,664,143 B2 | 12/2003 | Zhang | |
| 6,676,764 B2 | 1/2004 | Joo | |
| 2003/0151112 A1 | 8/2003 | Yamada et al. | |

* cited by examiner

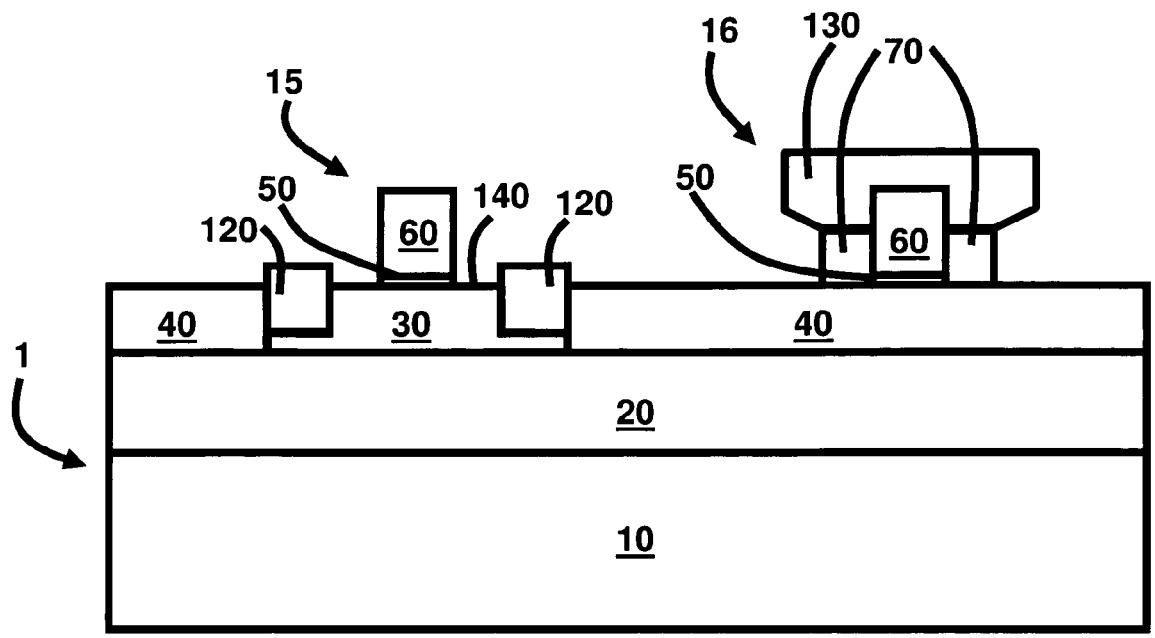
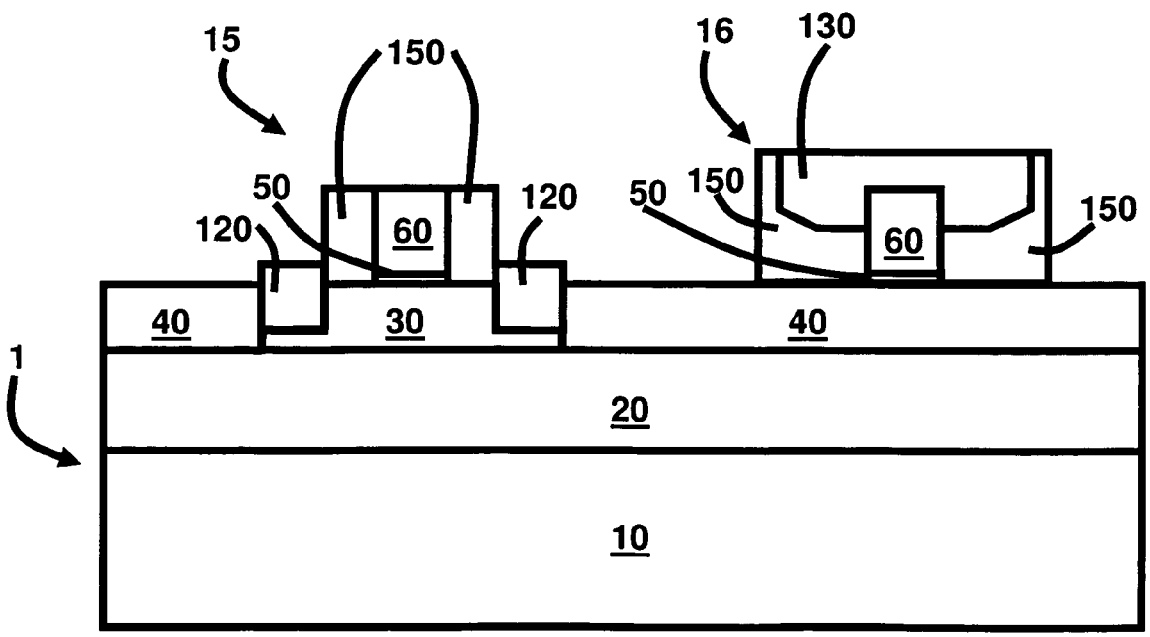

STRUCTURE AND METHOD FOR MOSFET GATE ELECTRODE LANDING PAD

CROSS-REFERENCE TO RELATED APPLICATIONS

This application is a Continuation of U.S. Pat. No. 7,528,065, issued May 5, 2009, the complete disclosure of which, in its entirety, is herein incorporated by reference.

BACKGROUND

1. Field of the Invention

The embodiments herein generally relate to microelectronic devices and fabrication methods thereof, and, more particularly, to techniques for enhancing the performance of microelectronic transistors and fabrication methods thereof.

2. Description of the Related Art

Field effect transistors (FET), also referred to as metal oxide semiconductor field effect transistors (MOSFET) or complementary metal oxide semiconductor (CMOS) transistors, are commonly utilized in integrated circuit devices including logic, memory, and microprocessor devices widely used in consumer and industrial applications. Generally, there is a small contact area margin in high-density synchronous random access memory (SRAM) devices and other at-pitch and random logic circuits between the interconnect contact and the gate electrode. Accordingly, there remains a need for a new technique for enhancing the performance and manufacturability of microelectronic transistors and fabrication methods.

SUMMARY

In view of the foregoing, an embodiment of the invention provides an integrated circuit (IC) comprising a substrate; a first gate electrode over the substrate; a second gate electrode over the substrate; and a landing pad comprising a pair of flanged ends overlapping the second gate electrode, wherein the structure of the second gate electrode is discontinuous with the structure of the landing pad. The IC may further comprise a buried oxide (BOX) layer over the substrate; a silicon on insulator (SOI) layer over the BOX layer; and a shallow trench isolation (STI) region over the BOX layer, wherein the first gate electrode is on the SOI layer, and wherein the second gate electrode is on the STI region.

Preferably, a width of the landing pad is greater than a width of the second gate electrode. Also, in one embodiment, the IC may comprise epitaxially-grown regions on opposite sides of the first gate electrode; a sidewall spacer adjacent to and on opposite sides of the first gate electrode; a gate dielectric layer in between the SOI layer and the first gate electrode; a salicide region on the first gate electrode and the epitaxially-grown regions; an interconnect contact connected to the salicide region; a dielectric liner over the first gate electrode, the sidewall spacer, the salicide region, and the STI region; and an interlevel dielectric layer over the dielectric liner.

Moreover, in another embodiment, the IC may comprise raised source and drain regions on opposite sides of the first gate electrode; a sidewall spacer adjacent to and on opposite sides of the first gate electrode; a gate dielectric layer in between the SOI layer and the first gate electrode; a salicide region on the first gate electrode and the raised source and drain regions; an interconnect contact connected to the salicide region; a dielectric liner over the first gate electrode, the sidewall spacer, the salicide region, and the STI region; and an interlevel dielectric layer over the dielectric liner.

Furthermore, in another embodiment, the IC may comprise a gate dielectric layer in between the STI region and the second gate electrode; a sidewall spacer adjacent to and on opposite sides of the second gate electrode, wherein the sidewall spacer contacts the landing pad; a salicide region on the landing pad; an interconnect contact connected to the salicide region; a dielectric liner over the sidewall spacer, the salicide region, and the STI region; and an interlevel dielectric layer over the dielectric liner. Preferably, the landing pad comprises epitaxially-grown material. Also, an upper surface of the landing pad is preferably higher than an upper surface of the first gate electrode.

Another embodiment herein provides a microelectronic device comprising a substrate; a first gate electrode over the substrate; a second gate electrode over the substrate; and a landing pad comprising a pair of flanged ends overlapping the second gate electrode, wherein the structure of the second gate electrode is discontinuous with the structure of the landing pad, wherein a width of the landing pad is greater than a width of the second gate electrode, and wherein an upper surface of the landing pad is higher than an upper surface of the first gate electrode. The microelectronic device may further comprise a BOX layer over the substrate; a SOI layer over the BOX layer; and a STI region over the BOX layer, wherein the first gate electrode is on the SOI layer, and wherein the second gate electrode is on the STI region.

In one embodiment, the microelectronic device may comprise epitaxially-grown regions on opposite sides of the first gate electrode; a sidewall spacer adjacent to and on opposite sides of the first gate electrode; a gate dielectric layer in between the SOI layer and the first gate electrode; a salicide region on the first gate electrode and the epitaxially-grown regions; an interconnect contact connected to the salicide region; a dielectric liner over the first gate electrode, the sidewall spacer, the salicide region, and the STI region; and an interlevel dielectric layer over the dielectric liner.

In another embodiment, the microelectronic device may comprise raised source and drain regions on opposite sides of the first gate electrode; a sidewall spacer adjacent to and on opposite sides of the first gate electrode; a gate dielectric layer in between the SOI layer and the first gate electrode; a salicide region on the first gate electrode and the raised source and drain regions; an interconnect contact connected to the salicide region; a dielectric liner over the first gate electrode, the sidewall spacer, the salicide region, and the STI region; and an interlevel dielectric layer over the dielectric liner.

In another embodiment, the microelectronic device may comprise a gate dielectric layer in between the STI region and the second gate electrode; a sidewall spacer adjacent to and on opposite sides of the second gate electrode, wherein the sidewall spacer contacts the landing pad; a salicide region on the landing pad; an interconnect contact connected to the salicide region; a dielectric liner over the sidewall spacer, the salicide region, and the STI region; and an interlevel dielectric layer over the dielectric liner. Preferably, the landing pad comprises epitaxially-grown material.

Another embodiment herein provides a field effect transistor (FET) comprising a substrate; a BOX layer over the substrate; a SOI layer over the BOX layer; a STI region over the BOX layer; a first gate structure on the SOI layer; a second gate structure on the STI region; and a landing pad attached to the second gate structure, wherein a width of the landing pad is greater than a width of the second gate structure, and wherein the structure of the second gate structure is discontinuous with the structure of the landing pad.

In one embodiment, the FET may further comprise epitaxially-grown regions on opposite sides of the first gate structure; a sidewall spacer adjacent to and on opposite sides of the first gate structure; a gate dielectric layer in between the SOI layer and the first gate structure; a salicide region on the first gate structure and the epitaxially-grown regions; an interconnect contact connected to the salicide region; a dielectric liner over the first gate structure, the sidewall spacer, the salicide region, and the STI region; and an interlevel dielectric layer over the dielectric liner.

In another embodiment, the FET may further comprise raised source and drain regions on opposite sides of the first gate structure; a sidewall spacer adjacent to and on opposite sides of the first gate structure; a gate dielectric layer in between the SOI layer and the first gate structure; a salicide region on the first gate structure and the raised source and drain regions; an interconnect contact connected to the salicide region; a dielectric liner over the first gate structure, the sidewall spacer, the salicide region, and the STI region; and an interlevel dielectric layer over the dielectric liner.

In another embodiment, the FET may further comprise a gate dielectric layer in between the STI region and the second gate structure; a sidewall spacer adjacent to and on opposite sides of the second gate structure, wherein the sidewall spacer contacts the landing pad; a salicide region on the landing pad; an interconnect contact connected to the salicide region; a dielectric liner over the sidewall spacer, the salicide region, and the STI region; and an interlevel dielectric layer over the dielectric liner. Preferably, the landing pad comprises epitaxially-grown material. Additionally, the landing pad preferably comprises a pair of flanged ends abutting the second gate structure. Moreover, an upper surface of the landing pad is preferably higher than an upper surface of the first gate structure.

Another embodiment herein provides a method of forming an integrated circuit, wherein the method comprises providing a substrate; patterning a first gate electrode over the substrate; patterning a second gate electrode over the substrate; and forming a landing pad comprising a pair of flanged ends and overlapping the second gate electrode, wherein the structure of the second gate electrode is discontinuous with the structure of the landing pad.

In one embodiment, the method may further comprise positioning a BOX layer over the substrate; placing a SOI layer over the BOX layer; and forming a STI region over the BOX layer, wherein the first gate electrode is on the SOI layer, and wherein the second gate electrode is on the STI region. In another embodiment, the method may further comprise configuring a width of the landing pad to be greater than a width of the second gate electrode.

In another embodiment, the method may further comprise selectively growing epitaxial regions on opposite sides of the first gate electrode; forming a sidewall spacer adjacent to and on opposite sides of the first gate electrode; positioning a gate dielectric layer in between the SOI layer and the first gate electrode; forming a salicide region on the first gate electrode and the epitaxially-grown regions; connecting an interconnect contact to the salicide region; laying a dielectric liner over the first gate electrode, the sidewall spacer, the salicide region, and the STI region; and placing an interlevel dielectric layer over the dielectric liner.

In another embodiment, the method may further comprise forming raised source and drain regions on opposite sides of the first gate electrode; positioning a sidewall spacer adjacent to and on opposite sides of the first gate electrode; configuring a gate dielectric layer in between the SOI layer and the first gate electrode; forming a salicide region on the first gate electrode and the raised source and drain regions; connecting an interconnect contact to the salicide region; laying a dielectric liner over the first gate electrode, the sidewall spacer, the salicide region, and the STI region; and placing an interlevel dielectric layer over the dielectric liner.

The method may further comprising positioning a gate dielectric layer in between the STI region and the second gate electrode; forming a sidewall spacer adjacent to and on opposite sides of the second gate electrode, wherein the sidewall spacer contacts the landing pad; configuring a salicide region on the landing pad; connecting an interconnect contact to the salicide region; laying a dielectric liner over the sidewall spacer, the salicide region, and the STI region; and forming an interlevel dielectric layer over the dielectric liner. Preferably, in the forming of the landing pad, the landing pad comprises epitaxially-grown material. Additionally, the method may further comprise configuring an upper surface of the landing pad to be higher than an upper surface of the first gate electrode. Also, the method may further comprise forming the landing pad in a separate processing step from the patterning of the second gate electrode.

Another embodiment herein provides a method of forming a FET, wherein the method comprises providing a substrate; depositing a BOX layer over the substrate; positioning a SOI layer over the BOX layer; forming a STI region over the BOX layer; patterning a first gate structure on the SOI layer; patterning a second gate structure on the STI region; and attaching a landing pad to the second gate structure, wherein a width of the landing pad is greater than a width of the second gate structure, and wherein the structure of the second gate structure is discontinuous with the structure of the landing pad.

In one embodiment, the method may further comprise forming epitaxially-grown regions on opposite sides of the first gate structure; attaching a sidewall spacer adjacent to and on opposite sides of the first gate structure; positioning a gate dielectric layer in between the SOI layer and the first gate structure; forming a salicide region on the first gate structure and the epitaxially-grown regions; connecting an interconnect contact to the salicide region; laying a dielectric liner over the first gate structure, the sidewall spacer, the salicide region, and the STI region; and placing an interlevel dielectric layer over the dielectric liner.

In another embodiment, the method may further comprise forming a gate dielectric layer in between the STI region and the second gate structure; attaching a sidewall spacer adjacent to and on opposite sides of the second gate structure, wherein the sidewall spacer contacts the landing pad; forming a salicide region on the landing pad; connecting an interconnect contact to the salicide region; laying a dielectric liner over the sidewall spacer, the salicide region, and the STI region; and placing an interlevel dielectric layer over the dielectric liner. Preferably, in the attaching of the landing pad to the second gate structure, the landing pad comprises epitaxially-grown material. Moreover, the method may further comprise configuring an upper surface of the landing pad to be higher than an upper surface of the first gate structure.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 1-10 are cross-sectional views during subsequent fabrication steps of an integrated circuit chip according to an embodiment herein.

DETAILED DESCRIPTION OF PREFERRED EMBODIMENTS

Figure 1:
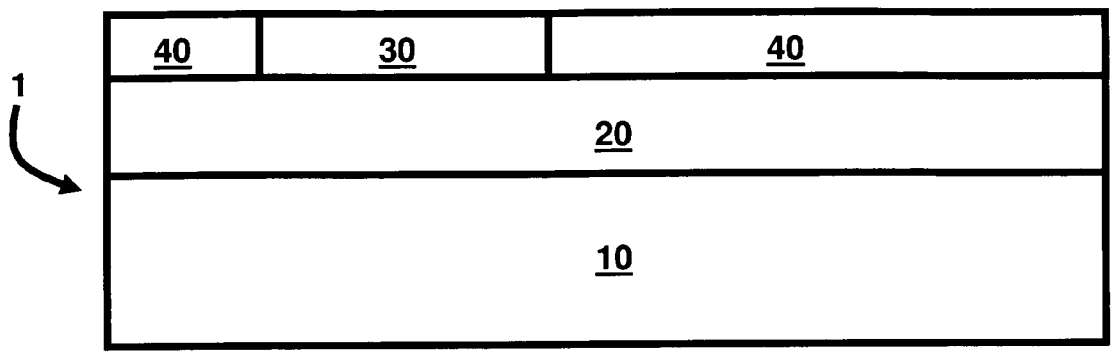

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a new technique for enhancing the performance and manufacturability of microelectronic transistors and fabrication methods. The embodiments of the invention achieve this by providing an enlarging landing pad on a gate electrode using a technique that maintains a simple line/space PC pattern and adds a block mask opening in combination with epitaxial silicon germanium (eSiGe) or a raised source/drain selective epitaxy process. Referring now to the drawings, and more particularly to FIGS. 1 through 11, where similar reference characters denote corresponding features consistently throughout the figures, there are shown preferred embodiments.

FIGS. 1 through 10 illustrate a set of sequential cross-sectional schematic diagrams for fabricating an integrated circuit chip 1 according to an embodiment herein. As shown in FIG. 1, a starting silicon-on-insulator (SOI) substrate 10 including shallow trench isolation is provided as is known to those skilled in the art. Alternatively, a bulk non-SOI substrate may also be used. In one embodiment, substrate 10 may comprise silicon, a silicon alloy, III-V, or a dielectric substrate, and a buried oxide (BOX) layer 20 is formed over the substrate 10, wherein the BOX layer 20 may comprise silicon dioxide preferably having an approximate thickness of 150 nm. A silicon on insulator (SOI) layer 30 is formed over the BOX layer 20, wherein the SOI layer 30 may comprise silicon preferably having an approximate thickness of 50 nm. Thereafter, shallow trench isolation (STI) regions 40 are formed using conventional microelectronics process techniques such photolithography, dry etch, chemical vapor deposition (CVD) oxide deposition, and chemical-mechanical planarization (CMP).

Figure 2:
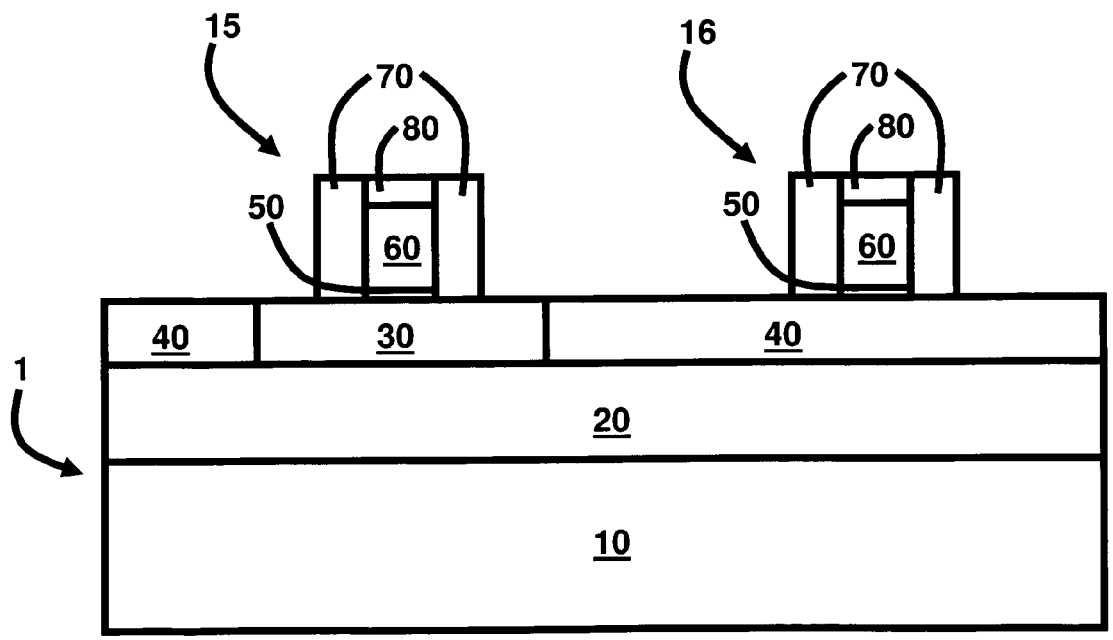

As illustrated in FIG. 2, MOSFET gate electrodes 15, 16 are formed, wherein each gate electrode 15, 16 comprises a gate dielectric layer 50 having a gate polysilicon layer 60 and a hard mask cap layer 80 formed thereon, and are generally formed using conventional microprocessing techniques such as thermal oxidation, nitridation, CVD, photolithography and dry etch. Additionally, a pair of sidewall spacers 70 is are positioned adjacent to the gate dielectric layer 50, gate polysilicon layer 60, and the hard mask cap layer 80 using conformal CVD deposition and anisotropic dry etch such as reactive ion etching (RIE). Preferably, the gate dielectric layer comprises silicon dioxide and is approximately 1 nm in thickness. Moreover, the gate polysilicon layer 60 preferably comprises CVD-deposited silicon having an approximate thickness of 100 nm. The sidewall spacers 70 preferably comprise a combination of SiN and SiO2 layers having an approximate thickness of 30 nm SiN, and 10 nm SiO2 and the dielectric hard mask cap 80 is preferably approximately 30 nm thick. In one embodiment, the gate electrode 15 is formed over the SOI silicon layer 30 as a MOSFET transistor, and the gate electrode 16 is formed over the STI region 40 and constitutes a part of an adjacent MOSFET device (not shown), or interconnection between two MOSFET devices (not shown).

Figure 3:
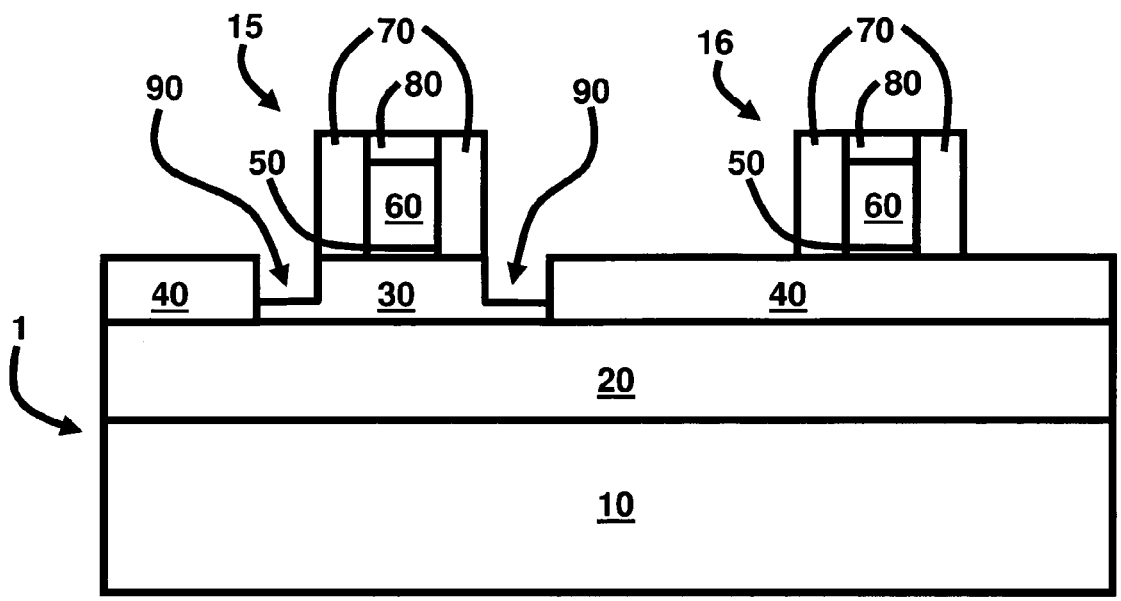
Figure 4:
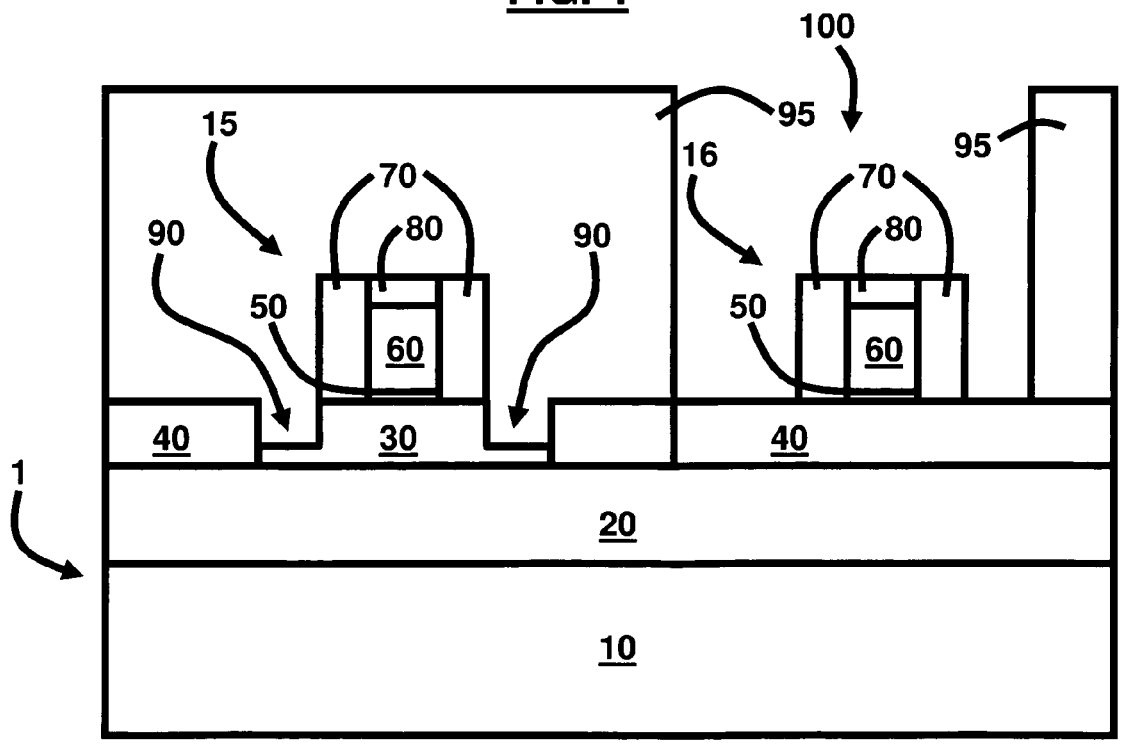

Next, as depicted in FIG. 3, the SOI layer 30 is etched using an anisotropic or isotropic dry etch such as reactive ion etching (RIE) in a chamber which includes the introduction of a combination of reactive gases HCl HBr, $Cl_2$, $SF_6$, and additives such as $N_2$, $O_2$, and Ar, and He. The SOI layer 30 is partially etched to leave an area 90 comprising the seed layer of the SOI layer 30 for subsequent epitaxial silicon growth. As shown in FIG. 4, the gate electrode 16 is masked using a masking layer 95, which may comprise an organic or inorganic material such as a photoresist or $SiO_2$. Then, the next step of the process involves patterning the IC chip 1 to create an exposed pattern region 100 for the gate electrode 16 using conventional photolithography techniques.

Figure 5:
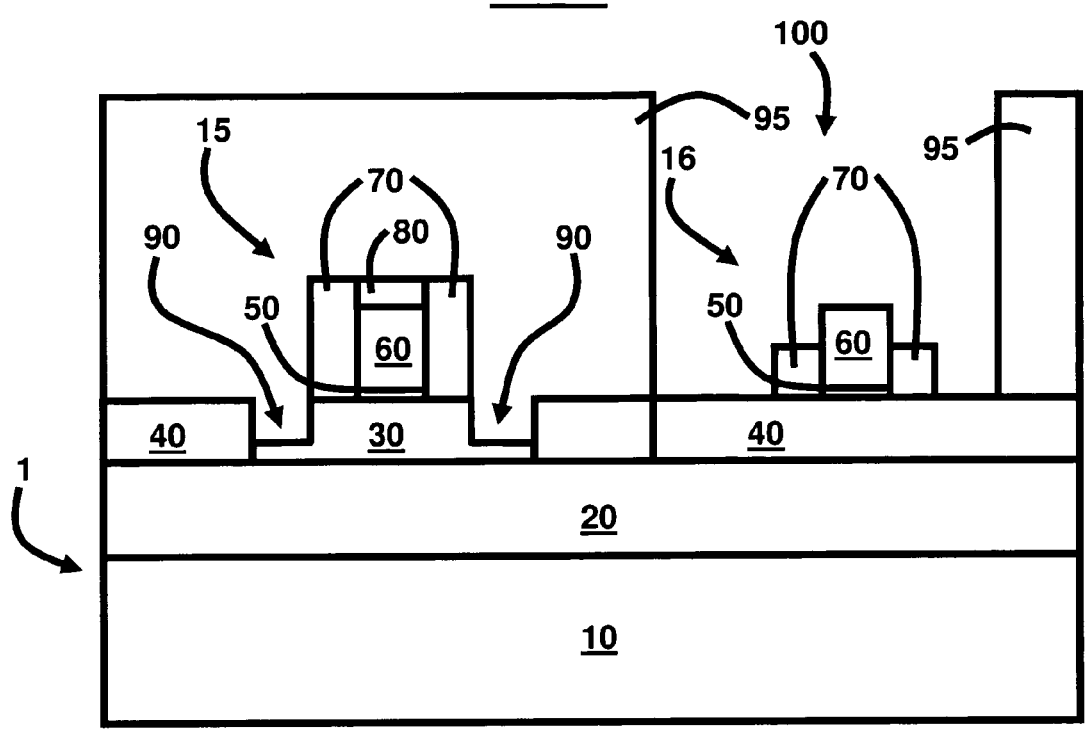
Figure 6:
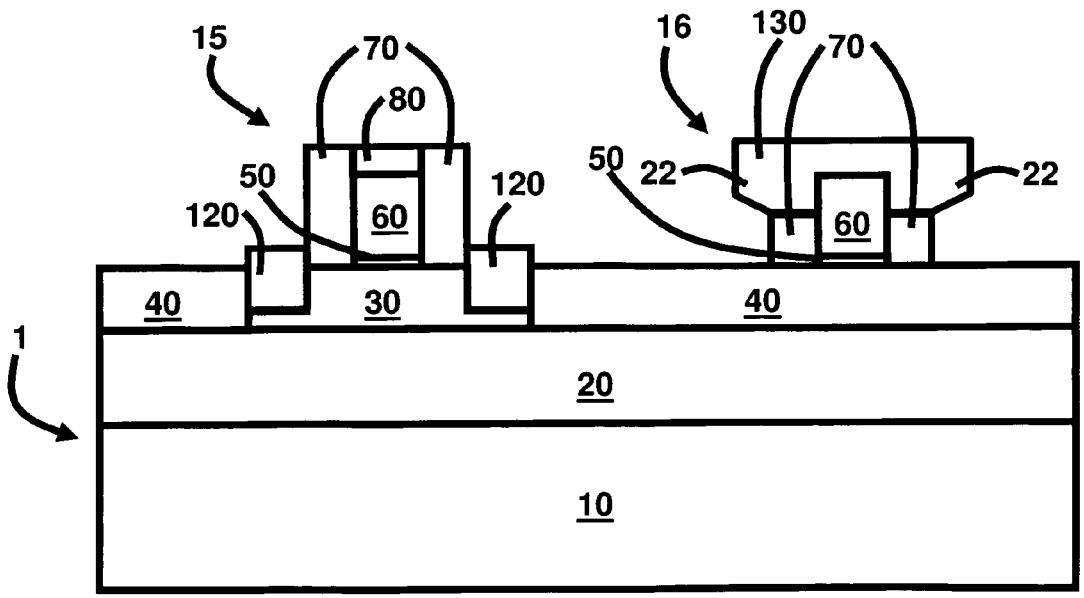

Next, as illustrated in FIG. 5, the hard mask cap 80 and portions of the sidewall spacers 70 are removed from the gate electrode 16 within the patterned region 100 to expose the gate polysilicon layer 60 using an anisotropic dry etch process such as RIE. Thereafter, as indicated in FIG. 6, the masking layer 95 is stripped from the IC chip 1, and preferably silicon or a combination of silicon and SiGe is grown using a selective epitaxial growth process to form an epi-layer 120 only on the exposed SOI layer 30 of gate electrode 15, and on the polysilicon layer 60 of gate electrode 16 to form a polysilicon landing pad 130 having a pair of flanged ends 22. The polysilicon layer 60 of gate electrode 15 is protected from the selective epitaxial growth by cap layer 80 and sidewall spacers 70. Additionally, semiconductor dopants (not shown) may be introduced using conventional doping techniques into the epitaxial regions 120, 130.

Figure 9:
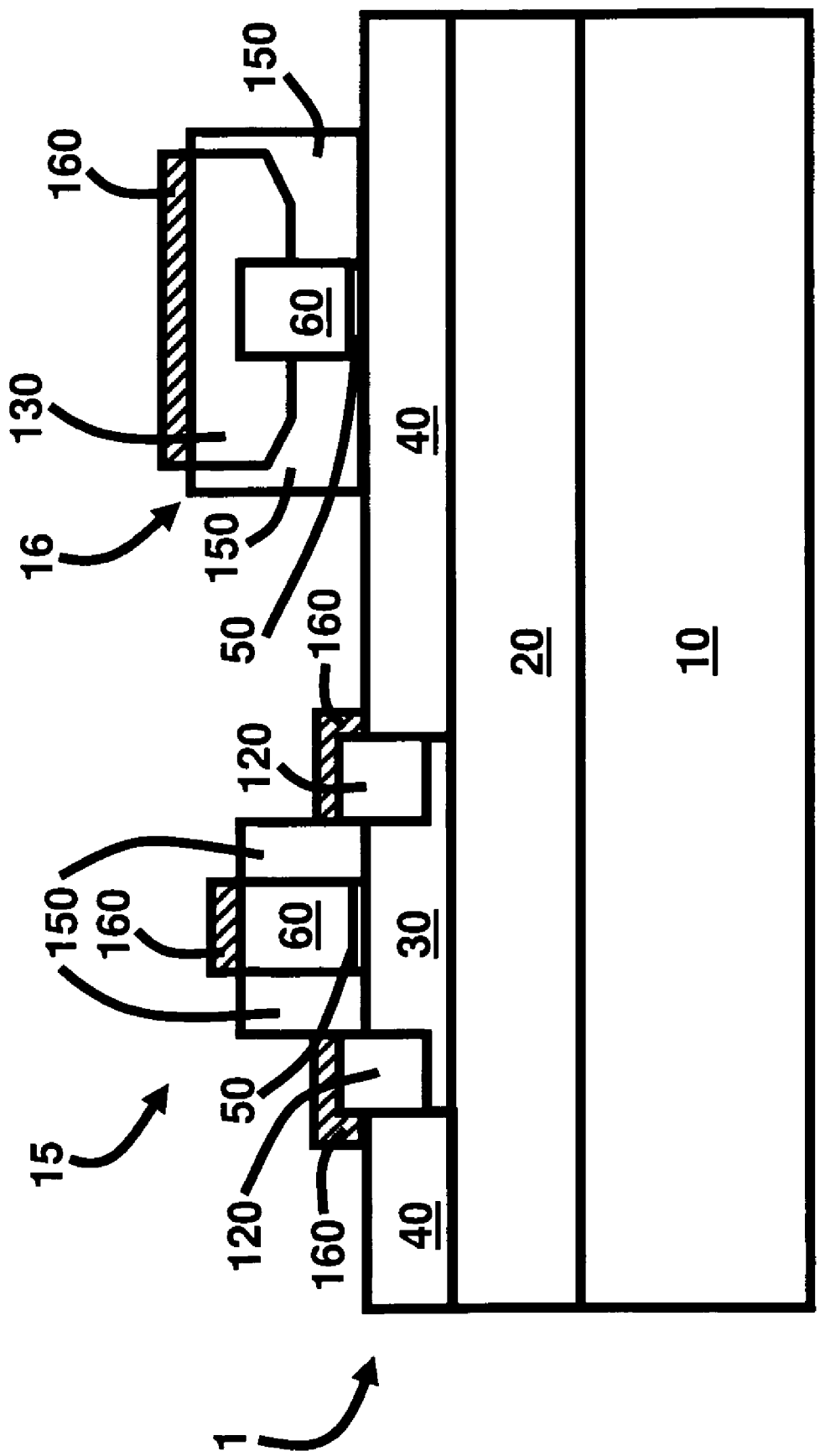
Figure 10:
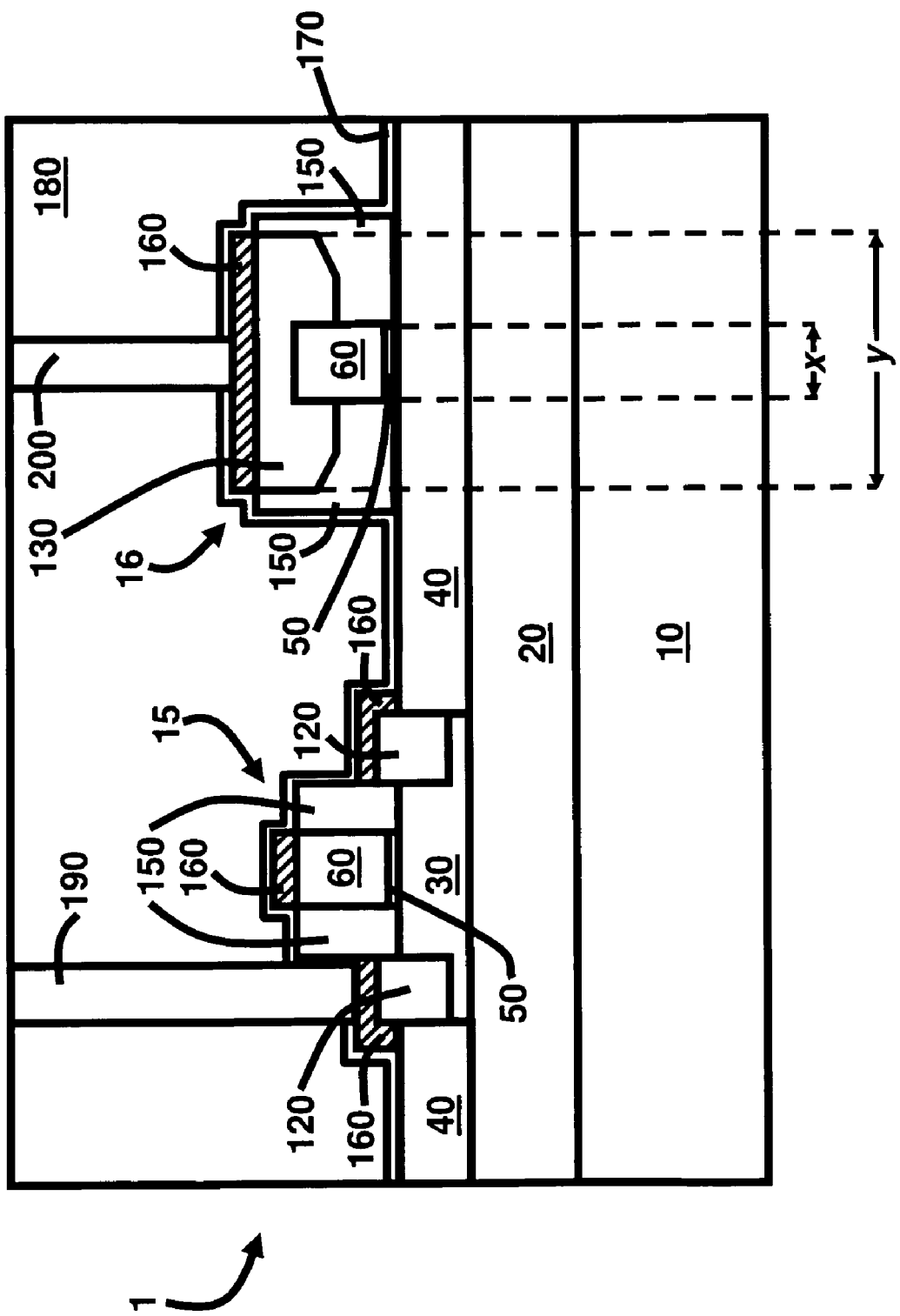

As shown in FIG. 7, the sidewall spacers 70 are stripped from the gate electrode 15 using a combination of anisotropic and isotropic etch processes such as RIE, to expose MOSFET extension regions 140 of the SOI layer 30. Thin sidewall oxidation (not shown) and MOSFET extension region device doping (not shown) may be formed using ion implantation as is customarily practiced by those skilled in the art. In FIG. 8, secondary sidewall spacers 150 are shown being formed on gates 15, 16 using conventional processes such as conformal deposition of SiN and anisotorpic etch by RIE. The sidewall spacers 150 on gate 16 merges with the existing sidewall spacers 70 on gate 16 and for clarity are shown in FIGS. 8-10 as sidewall spacers 150. Additional MOSFET doping (not shown) may be introduced by ion implantation and activation anneals to adjust and optimize the transistor electrical and physical characteristics.

Thereafter, as illustrated in FIG. 9, a self-aligned silicide (salicide) process is performed to create a salicide region 160 over the epitaxial regions 120, 130, portions of the STI regions 140, and above the polysilicon layer 60 in gate 15 as is known to those skilled in the art. Preferably, the salicide region 160 comprises any of CoSi, NiSi, TiSi, PtSi, NiPtSi, or other suitable alloys and is formed using conventional process techniques such as deposition, anneal, and selective etching. Then, as shown in FIG. 10, a dielectric liner 170 such as stressed SiN is formed over the entire IC chip 1 or selected regions of the chip 1. Following this step, an interlevel dielectric (ILD) such as silicon dioxide 180 is deposited by CVD and planarized by CMP over the dielectric liner 170. Next, metal contacts 190, 200 are formed using standard lithography, RIE, metal deposition and CMP techniques. For example, metal contact 190 contacts the salicide region 160 over the epitaxial region 120 over the SOI layer 30, and metal contact 200 contacts the salicide region 160 over the gate electrode 16. Additional vias (not shown) and contacts may be formed according to other embodiments herein.

The completed MOSFET structure 1 as illustrated in FIG. 10 with landing pad 130 affords improved manufacturing tolerances for the overlay registration of the contact 200 to the MOSFET gate electrode device 16. The difference in size between regions x and y in FIG. 10 illustrates the improved and enlarged landing area for contact 200 on device 16. The increase in landing width from x to y can be on the order of the patterned MOSFET gate electrode 60 characteristic dimension. For example, for a MOSFET gate of 20 nm line width thickness, the landing area for contact 200 may be advantageously increased to 40 nm. The larger landing area on the IC chip 1 allows for improved manufacturing tolerance, reduced variation in contact resistance, and improved interconnect reliability.

Generally, the embodiments herein provide a technique to etch open the landing pad regions of the PC cap before epitaxial growth and use the enlarged epitaxial region on PC poly as CA landing pad area. The embodiments herein complement the selective-epi embedded SiGe techniques, and are applicable to both bulk and SOI CMOS, bipolar, memory and sensor technologies. Compared to the conventional T-gate structures where the gate regions has a "T" shape, the embodiments herein provide a technique offering a better area density, since the active area gate structure does not over-shadow (typically, in a T-gate structure, the upper part of the T can shadow the source/drain silicon region directly under the overhanging region of the T) the source/drain region. The approach provided by the embodiments herein is also more compatible with mainstream down-scaling CMOS technology because the approach provided by the embodiments herein may be inserted into the standard eSiGe CMOS process flow as an extra block mask and etch step.

Figure 11:
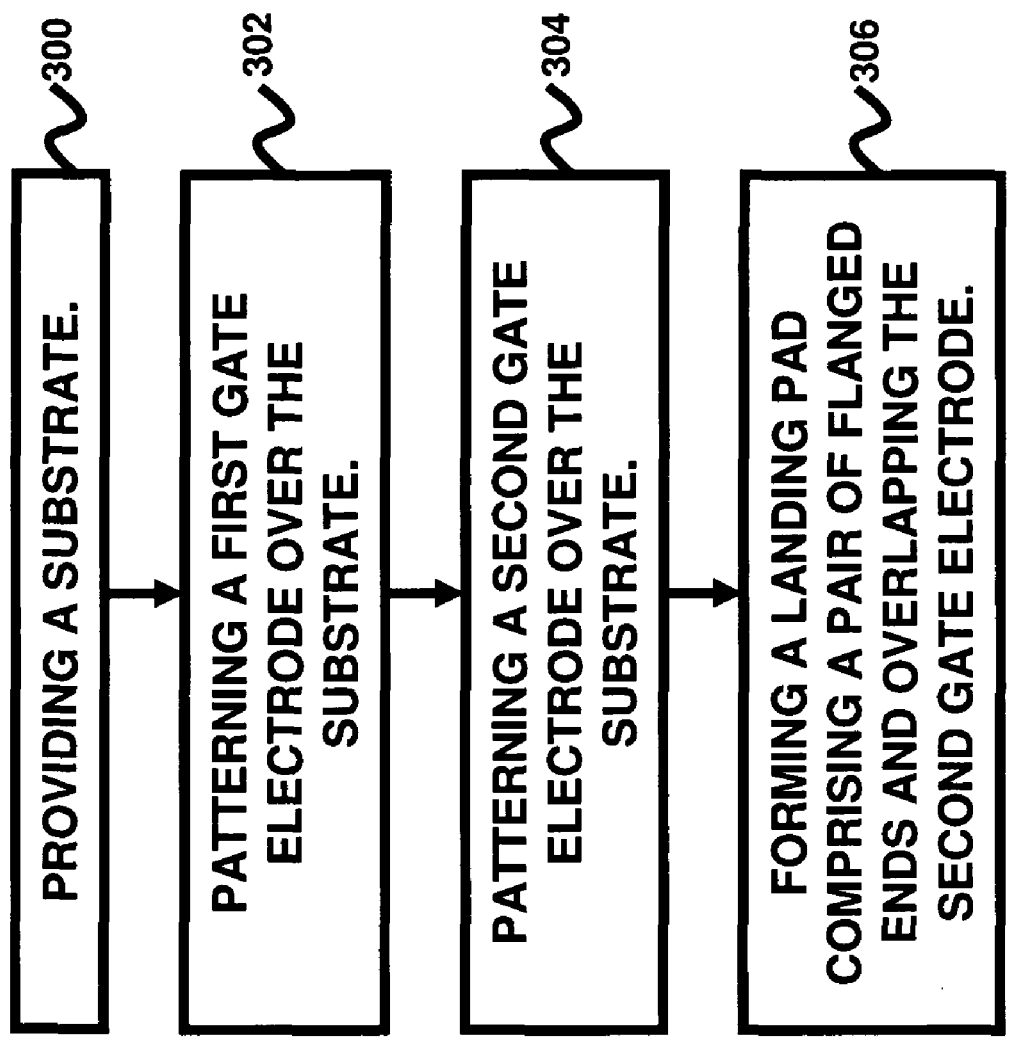
FIG. 11 is a flow diagram illustrating a preferred method according to an embodiment herein.

FIG. 11, with reference to FIGS. 1-10, illustrates a flow diagram according to an embodiment herein, wherein the flow diagram illustrates a method of forming an integrated circuit 1, wherein the method comprises providing (300) a substrate 10; patterning (302) a first gate electrode 15 over the substrate 10; patterning (304) a second gate electrode 16 over the substrate 10; and forming (306) a landing pad 130 comprising a pair of flanged ends 22 and overlapping the second gate electrode 15, wherein the structure of the second gate electrode 15 is discontinuous with the structure of the landing pad 130.

The techniques provided by the embodiments herein facilitate fabrication of an integrated circuit chip 1. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Generally, an embodiment herein provides a technique of forming a MOSFET gate electrode landing pad 130 and a resulting structure, wherein the method comprises forming MOSFET gate electrodes 15, 16 with a cap dielectric 80; and forming a landing pad 130 on gate electrode 16 in a separate step from the patterning of the gate electrode conductor (i.e., polysilicon 60). The landing pad 130 is formed by patterning regions 100 of the gate electrode 16 over STI 40 using photolithography; etching the sidewall spacers 70 and cap layer 80 on gate electrode 16 to expose the underlying gate electrode polysilicon 60; application of selective epitaxy to grow silicon 120, 130 on the exposed regions of gate electrodes 15, 16 and SOI layer 30; subsequent processing to form MOSFET including ion implantation, anneals and salicidation; forming contacts 190, 200 onto gate electrode landing pad 130; and forming interconnect wiring (not shown) between contacts 190, 200 and other regions of the chip 1. The gate electrode landing pad region 130 with enlarged surface area hangs over the underlying STI region 40. Moreover, the gate electrode 16 is discontinuous (i.e., are different structures) with the landing pad 130. The landing pad structure 130 may be applied to integrated circuit devices including any of a memory element, dynamic random access memory (DRAM), SRAM, flash memory, fuse, antifuse, resistor, capacitor, magnetoresistive random access memory (MRAM), gate array, microelectromechanical systems (MEMS), photodetector, charge coupled device (CCD), and print head.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A field effect transistor (FET) comprising:
   a substrate;
   a buried oxide (BOX) layer over said substrate;
   a silicon on insulator (SOI) layer over said BOX layer;
   a shallow trench isolation (STI) region over said BOX layer;
   a first gate structure on said SOI layer;
   a second gate structure on said STI region; and a landing pad comprising epitaxially-grown material including a pair of flanged ends attached to said second gate structure,
wherein said pair of flanged ends having a width greater than a width of said second gate structure,
wherein a width of said landing pad is greater than a width of said second gate structure,
wherein the structure of said second gate structure is discontinuous with the structure of said landing pad,
wherein said pair of flanged ends are overlapping said second gate structure, and
wherein said pair of flanged ends abuts said second gate structure.

2. The FET of claim 1, wherein an upper surface of said landing pad is higher than an upper surface of said first gate structure.

3. The FET of claim 1, further comprising:
epitaxially-grown regions on opposite sides of said first gate structure;
a sidewall spacer adjacent to and on opposite sides of said first gate structure;
a gate dielectric layer in between said SOI layer and said first gate structure;
a salicide region on said first gate structure and said epitaxially-grown regions;
an interconnect contact connected to said salicide region;
a dielectric liner over said first gate structure, said sidewall spacer, said salicide region, and said STI region; and
an interlevel dielectric layer over said dielectric liner.

4. The FET of claim 1, further comprising:
raised source and drain regions on opposite sides of said first gate structure;
a sidewall spacer adjacent to and on opposite sides of said first gate structure;
a gate dielectric layer in between said SOI layer and said first gate structure;
a salicide region on said first gate structure and said raised source and drain regions;
an interconnect contact connected to said salicide region;
a dielectric liner over said first gate structure, said sidewall spacer, said salicide region, and said STI region; and
an interlevel dielectric layer over said dielectric liner.

5. The FET of claim 1, further comprising:
a gate dielectric layer in between said STI region and said second gate structure;
a sidewall spacer adjacent to and on opposite sides of said second gate structure, wherein said sidewall spacer contacts said landing pad;
a salicide region on said landing pad;
an interconnect contact connected to said salicide region;
a dielectric liner over said sidewall spacer, said salicide region, and said STI region; and
an interlevel dielectric layer over said dielectric liner.

6. An integrated circuit comprising:
a substrate;
a first gate electrode over said substrate;
a second gate electrode over said substrate; and
a landing pad comprising epitaxially-grown material including a pair of flanged ends having a width greater than a width of said second gate electrode,
wherein the structure of said second gate electrode is discontinuous with the structure of said landing pad,
wherein said pair of flanged ends are overlapping said second gate electrode, and
wherein said pair of flanged ends abuts said second gate structure.

7. The integrated circuit of claim 6, further comprising:
a buried oxide (BOX) layer over said substrate;
a silicon on insulator (SOI) layer over said BOX layer; and
a shallow trench isolation (STI) region over said BOX layer,
wherein said first gate electrode is on said SOI layer, and wherein said second gate electrode is on said STI region.

8. The integrated circuit of claim 7, further comprising:
epitaxially-grown regions on opposite sides of said first gate electrode;
a sidewall spacer adjacent to and on opposite sides of said first gate electrode;
a gate dielectric layer in between said SOI layer and said first gate electrode;
a salicide region on said first gate electrode and said epitaxially-grown regions;
an interconnect contact connected to said salicide region;
a dielectric liner over said first gate electrode, said sidewall spacer, said salicide region, and said STI region; and
an interlevel dielectric layer over said dielectric liner.

9. The integrated circuit of claim 7, further comprising:
raised source and drain regions on opposite sides of said first gate electrode;
a sidewall spacer adjacent to and on opposite sides of said first gate electrode;
a gate dielectric layer in between said SOI layer and said first gate electrode;
a salicide region on said first gate electrode and said raised source and drain regions;
an interconnect contact connected to said salicide region;
a dielectric liner over said first gate electrode, said sidewall spacer, said salicide region, and said STI region; and
an interlevel dielectric layer over said dielectric liner.

10. The integrated circuit of claim 7, further comprising:
a gate dielectric layer in between said STI region and said second gate electrode;
a sidewall spacer adjacent to and on opposite sides of said second gate electrode, wherein said sidewall spacer contacts said landing pad;
a salicide region on said landing pad;
an interconnect contact connected to said salicide region;
a dielectric liner over said sidewall spacer, said salicide region, and said STI region; and
an interlevel dielectric layer over said dielectric liner.

11. The integrated circuit of claim 6, wherein an upper surface of said landing pad is higher than an upper surface of said first gate electrode.

12. A microelectronic device comprising:
a substrate;
a first gate electrode over said substrate;
a second gate electrode over said substrate; and
a landing pad comprising epitaxially-grown material including a pair of flanged ends having a width greater than a width of said second gate electrode,
wherein the structure of said second gate electrode is discontinuous with the structure of said landing pad,
wherein a width of said landing pad is greater than a width of said second gate electrode,
wherein an upper surface of said landing pad is higher than an upper surface of said first gate electrode,
wherein said pair of flanged ends are overlapping said second gate electrode, and
wherein said pair of flanged ends abut said second gate structure.

13. The microelectronic device of claim 12, further comprising:
a buried oxide (BOX) layer over said substrate;
a silicon on insulator (SOI) layer over said BOX layer; and a shallow trench isolation (STI) region over said BOX layer,
wherein said first gate electrode is on said SOI layer, and wherein said second gate electrode is on said STI region.

14. The microelectronic device of claim 13, further comprising:
epitaxially-grown regions on opposite sides of said first gate electrode;
a sidewall spacer adjacent to and on opposite sides of said first gate electrode;
a gate dielectric layer in between said SOI layer and said first gate electrode;
a salicide region on said first gate electrode and said epitaxially-grown regions;
an interconnect contact connected to said salicide region;
a dielectric liner over said first gate electrode, said sidewall spacer, said salicide region, and said STI region; and
an interlevel dielectric layer over said dielectric liner.

15. The microelectronic device of claim 13, further comprising:
raised source and drain regions on opposite sides of said first gate electrode;
a sidewall spacer adjacent to and on opposite sides of said first gate electrode;
a gate dielectric layer in between said SOI layer and said first gate electrode;
a salicide region on said first gate electrode and said raised source and drain regions;
an interconnect contact connected to said salicide region;
a dielectric liner over said first gate electrode, said sidewall spacer, said salicide region, and said STI region; and
an interlevel dielectric layer over said dielectric liner.

16. The microelectronic device of claim 13, further comprising:
a gate dielectric layer in between said STI region and said second gate electrode;
a sidewall spacer adjacent to and on opposite sides of said second gate electrode, wherein said sidewall spacer contacts said landing pad;
a salicide region on said landing pad;
an interconnect contact connected to said salicide region;
a dielectric liner over said sidewall spacer, said salicide region, and said STI region; and
an interlevel dielectric layer over said dielectric liner.

* * * * *